(12) United States Patent
Hartberger

(10) Patent No.: US 8,315,025 B2
(45) Date of Patent: Nov. 20, 2012

(54) CIRCUIT ARRANGEMENT FOR PROTECTION AGAINST ELECTROSTATIC CHARGES AND METHOD FOR DISSIPATION THEREOF

(75) Inventor: Andreas Hartberger, Graz (AT)

(73) Assignee: austriamicrosystems AG, Unterpremstatten (AT)

( * ) Notice: Subject to any disclaimer, the term of this patent is extended or adjusted under 35 U.S.C. 154(b) by 171 days.

(21) Appl. No.: 12/676,577

(22) PCT Filed: Aug. 28, 2008

(86) PCT No.: PCT/EP2008/061336
§ 371 (c)(1),
(2), (4) Date: May 21, 2010

(87) PCT Pub. No.: WO2009/030639
PCT Pub. Date: Mar. 12, 2009

(65) Prior Publication Data
US 2010/0290165 A1    Nov. 18, 2010

(30) Foreign Application Priority Data

Sep. 5, 2007    (DE) .......................... 10 2007 042 103

(51) Int. Cl.
*H02H 3/22* (2006.01)
(52) U.S. Cl. ......................................... 361/56; 361/111
(58) Field of Classification Search .................. 361/56, 361/111
See application file for complete search history.

(56) References Cited

U.S. PATENT DOCUMENTS

| 5,508,649 | A | 4/1996 | Shay |
| 6,552,886 | B1 | 4/2003 | Wu et al. |
| 6,690,555 | B1 | 2/2004 | Pasqualini |
| 6,972,939 | B1 | 12/2005 | Ho et al. |
| 7,102,862 | B1 | 9/2006 | Lien et al. |
| 7,187,530 | B2 | 3/2007 | Salling et al. |
| 7,423,855 | B2 * | 9/2008 | Fankhauser et al. ............ 361/56 |
| 2004/0125521 | A1 | 7/2004 | Salling et al. |
| 2006/0176626 | A1 | 8/2006 | Griesbach et al. |
| 2007/0030610 | A1 | 2/2007 | Ker et al. |
| 2007/0076338 | A1 | 4/2007 | Traynor et al. |
| 2007/0109698 | A1 | 5/2007 | Kim |
| 2007/0201173 | A1 | 8/2007 | Chu et al. |
| 2008/0007882 | A1 * | 1/2008 | Bernard et al. ................. 361/56 |

FOREIGN PATENT DOCUMENTS

| DE | 103 49 405 | 5/2005 |
| KR | 10-0651579 | 11/2006 |

* cited by examiner

*Primary Examiner* — Danny Nguyen
(74) *Attorney, Agent, or Firm* — Cozen O'Connor

(57) ABSTRACT

A circuit arrangement for protection against electrostatic discharges comprises an shunt device, which is connected between a first and a second terminal of the circuit arrangement and has a control input, via which the conduction of the shunt device can be controlled. In addition there is a trigger element, which has a trigger output for issuing a trigger signal in dependence on a voltage between the first and the second terminal of the circuit arrangement. The circuit arrangement additionally comprises an interruption unit that can be controlled via a deactivation input by means of a sendable deactivation signal and which is connected on the input side to the trigger output and on the output side to the control input. In addition, a method for shunting electrostatic discharges is shown.

18 Claims, 1 Drawing Sheet

CIRCUIT ARRANGEMENT FOR PROTECTION AGAINST ELECTROSTATIC CHARGES AND METHOD FOR DISSIPATION THEREOF

The invention concerns a circuit arrangement for protection against electrostatic discharges and a method for shunting electrostatic discharges.

Static electricity arises due to an imbalance of electrons on the surface of a material. This imbalance leads to an electrostatic charge. An electrostatic charge is caused, for example, by friction in the case of a so-called triboelectric charge. The field generated in the charge can trigger an electrostatic discharge (ESD). A transport of the charge between units having different electric potentials takes place. An electrostatic discharge in an electrical circuit can result in high currents through the circuit. In particular in the case of integrated circuits it is possible that the circuit will be destroyed by this. On the other hand, an electrostatic discharge can result in an adverse effect on the circuit, so that while the circuit initially remains functional, its lifespan is clearly reduced. Circuits are potentially exposed to electrostatic discharges during the entire process from manufacture through transport up to the end user and technical servicing.

To protect a circuit against electrostatic discharges one can provide protective circuits, which drain a current if there is an electrostatic discharge and in this way are able to keep the circuit from being destroyed. Traditional protective circuits are capable of detecting an electrostatic discharge and actively draining it. One such circuit is described in WO 2005/041375, for example.

The task of this invention is to specify a circuit with which and a method with which shunting electrostatic discharges is further improved.

This task is solved by the circuit arrangement of Claim 1 and the method of Claim 15. Further developments and embodiments of the invention are the objects of the dependent claims.

In one embodiment a circuit arrangement for protection against electrostatic discharges comprises a shunt device, a trigger element and an interruption unit. The shunt device is connected between a first and a second terminal of the circuit arrangement and has a control input, via which the conduction of the shunt device can be controlled. The trigger element has a trigger output to issue a trigger signal in dependence on a voltage between the first and second terminal. The interruption unit is connected on the input side to the trigger output and on the output side to the control input of the shunt device and can be controlled by means of a deactivation signal via a deactivation input.

An electrostatic discharge that arises between the first and the second terminal of the circuit arrangement is recognized by the trigger element. In this case the trigger element generates the trigger signal. For the case where the interruption unit is inactive through the deactivation input, the trigger signal is sent to the control input of the shunt device. With that the shunt device is put into a conducting state. A current produced by the electrostatic discharge can drain off via the shunt device. In this way, for example, components of a circuit that are connected subsequently at the first and second terminals can be kept from damage.

Advantageously, the circuit arrangement enables controllable drainage of ESD pulses through the deactivation signal supplied to the deactivation input.

In another development the deactivation signal which can be supplied is designed to differentiate between an in-circuit and an off-circuit state of the circuit arrangement.

The interruption unit is then deactivated via the deactivation input, if no external energy source, for example a power supply is connected to the circuit arrangement and thus also to the circuit that is to be protected. This state is called off-circuit. In the opposite case, thus when an external power supply is connected to the circuit arrangement and the circuit that is to be protected is connected, in the so-called in-circuit state, the interruption unit becomes activated via the deactivation input. In this case the signal generated by the trigger element is not transmitted to the shunt device.

Advantageously, this circuit arrangement recognizes if it is in off-circuit or in-circuit state. Only electrostatic discharges arising in off-circuit state are drained via the shunt device. Voltage peaks occurring between the first and the second terminal of the circuit arrangement in in-circuit state, such as are caused, for example, by adjacent DC/DC converters, are recognized as an electrostatic discharge by the trigger element, but are not propagated to the shunt device because of the interruption unit. Advantageously, thus an undesirable breakdown of the supply voltage by short circuiting of the two terminals of the circuit arrangement is prevented. On the other hand, electrostatic discharges arising, for example, during manufacture or transport, which occur in a power down state of a circuit, are reliably recognized and shunted.

Preferably, the circuit arrangement is in in-circuit state, when it is in power on state. If the circuit is in power down state, it is preferably in off-circuit state.

In one embodiment the shunt device comprises a transistor, whose control path is connected between the first and the second terminal. For example, the shunt device comprises an n-channel field effect transistor for this. Through the control of the transistor in a low-ohmage state a current caused by an electrostatic discharge is drained via said transistor.

In one embodiment the trigger element is connected between the first and the second terminal of the circuit arrangement.

In one embodiment the trigger element comprises a series circuit having a first resistor and a first capacitor and a first inverter connected at their connecting point.

The trigger signal is provided at the output of the first inverter. An inverter inverts the signal at its input and provides this inverted signal at its output.

The trigger element is preferably set up to recognize an ESD event both during in-circuit and during off-circuit state and to generate the trigger signal accordingly. For example, a ripple, i.e. a brief distortion of the supply voltage, or noise on the supply line is recognized as an SSD event.

In another embodiment the interruption unit comprises a series circuit having a first and a second transistor, where a connecting point between the gate terminal of the first transistor and the gate terminal of the second transistor forms the deactivation input for supplying the deactivation signal.

In an advantageous embodiment the first transistor of the interruption unit is designed as a p-channel field effect transistor and the second transistor of the interruption unit is designed as an n-channel field effect transistor.

The interruption unit is controlled via the deactivation signal supplied to the deactivation input so that the trigger signal of the trigger element is advantageously propagated only in off-circuit state.

In another advantageous development the circuit arrangement comprises a series circuit having a second and a third inverter, where the input of the second inverter is connected to the output of the interruption unit and the output of the third inverter is connected to the control input of the shunt device.

In another advantageous embodiment of the circuit arrangement the input of the second inverter is connected via a pull-down resistor to the second terminal of the circuit arrangement and the input of the third inverter is connected via a pull-up resistor to the first terminal of the circuit arrangement. Here the first, second and third inverters are designed so that the driver strength within the inverter chain rises in the signal direction, so that the control of the next inverter of the chain in each case takes place at a given time.

A trigger signal generated due to an ESD pulse is sent to the shunt device via the second and the third inverter in off-circuit state. The transistor of the shunt device is thus put in a conducting state and can shunt the current.

In an advantageous development the circuit arrangement comprises a stabilization element, which is connected between the control input of the shunt device and the second terminal of the circuit arrangement. The stabilization element is preferably set up to fix the control input of the shunt device in the in-circuit state at low in order to suppress an undesirable switching of the shunt device to the conducting state caused by the high gate drain capacity of the shunt device.

In another advantageous development the stabilization element has a parallel circuit comprising an additional resistor and an additional transistor, the control input of which is controlled by the deactivation signal. This transistor is designed, for example, as an n-channel field effect transistor.

In an advantageous development the circuit arrangement comprises a series circuit having a second resistor and a second capacitor with a connecting point for provision of the deactivation signal. The series circuit is connected between the first and the second terminal of the circuit arrangement.

Advantageously, the deactivation signal is generated when the circuit arrangement is in the in-circuit state.

In an advantageous development the second resistor and the second capacitor form a second time constant, which is 10 times greater than a first time constant, which is formed by the first resistor and the first capacitor of the trigger element.

In an alternative embodiment the first resistor and the second resistor can each be designed as p-channel field effect transistors. The width-to-length ratio of the channel here is relatively small.

In an alternative embodiment the first capacitor and the second capacitor are each designed as a transistor.

In an alternative embodiment the first transistor of the interruption unit can be designed as a transmission gate.

In one embodiment a method for shunting electrostatic discharges comprises the generation of a trigger signal in dependence on a voltage between a first and a second terminal of a circuit arrangement, the generation of a deactivation signal in dependence on the availability of an external power supply and conductive connection of the first and the second terminal if the trigger signal is present and the deactivation signal is not present.

Advantageously, the deactivation signal is generated when an external voltage supply is connected to the circuit. The circuit therefore is in in-circuit state. Thus a trigger signal generated in in-circuit state does not lead to a conductive connection of the first and the second terminal. A collapse of the power supply with restarting of the power supply is thus avoided. On the other hand, in the absence of an external power supply, thus in off-circuit state of the circuit, a deactivation signal is not generated. Thus, a trigger signal generated in off-circuit state by an electrostatic discharge leads to a conductive connection of the first and the second terminal of the circuit arrangement. The electrostatic discharge is thus reliably drained.

In an advantageous development the conductive connection of the first and the second terminal takes place by means of an n-channel field effect transistor.

In an advantageous development the trigger signal is generated when the voltage between the first and the second terminal exceeds a positive threshold value or goes below a negative threshold value.

In an advantageous development the deactivation signal is generated when the external power supply is connected.

The invention will now be explained in more detail by means of two embodiment examples using the figures. Components and circuit parts that have like function or activity have like reference numbers. To the extent that the functions of circuit parts or components correspond, their description is not repeated in every one of the following figures.

Here:

FIG. 1 shows an exemplary embodiment of a circuit arrangement in accordance with the proposed principle. The circuit arrangement comprises a trigger element TE, a deactivation element DE, an interruption unit UE, an inverter chain IK, a stabilization element SE and a shunt device AE.

Figure 1:
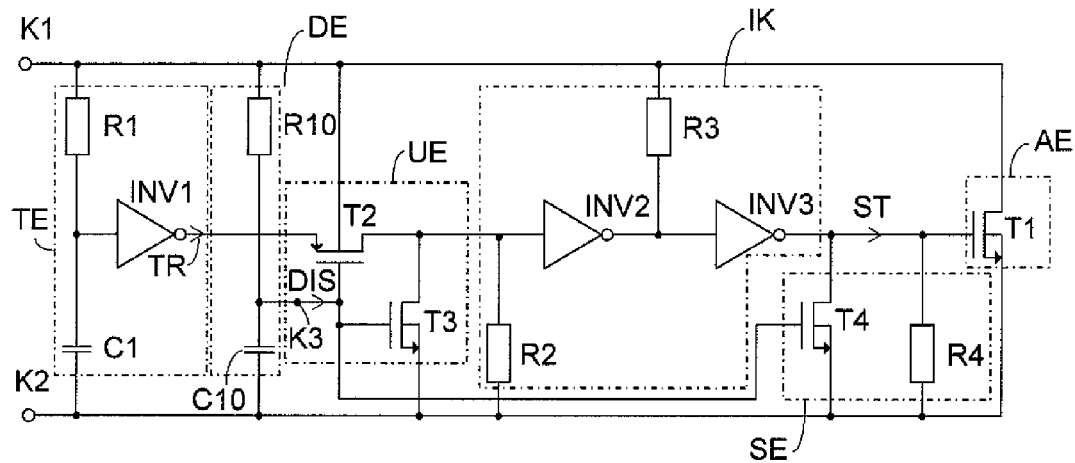
FIG. 1 shows an exemplary embodiment of a circuit arrangement in accordance with the proposed principle.

The trigger element TE is connected between a first terminal K1 and a second terminal K2 of the circuit arrangement and has an output for provision of a trigger signal TR. The trigger element TE has a series circuit comprising a resistor R1 and a capacitor C1, to the connecting point of which an inverter INV1 is connected. The trigger signal TR is provided at the output of inverter INV1.

The deactivation element DE is connected between the first terminal K1 and the second terminal K2. It has a series circuit comprising a resistor R10 and a capacitor C10. A deactivation signal DIS is generated at the connecting point between resistor R10 and capacitor C10.

The interruption unit UE has a deactivation input K3 for supplying the deactivation signal DIS. The output of the interruption unit UE is connected to the input of the inverter chain IK. The interruption unit UE comprises a series circuit having a transistor T2 and a transistor T3, where the connecting point between the gate terminal of transistor T2 and the gate terminal of transistor T3 forms the deactivation input K3. Transistor T2 in this case is implemented, for example, as a p-channel field effect transistor, while transistor T3 is designed, for example, as an n-channel field effect transistor. The source terminal of transistor T2 is connected to the output of inverter INV1, so that the trigger signal TR is supplied here. The drain terminal of transistor T2 is connected to the drain terminal of transistor T3. The source terminal of transistor T3 is connected to the second terminal K2 of the circuit arrangement. The connecting point between the drain terminals of transistor T2 and transistor T3 forms the output of the interruption unit and is connected to the input of the inverter chain IK.

The inverter chain IK comprises a series circuit having an inverter INV2 and an inverter INV3. The input of inverter INV2 is connected to the second terminal K2 of the circuit arrangement via a resistor R2. The input of terminal INV3 is connected to the first terminal K2 of the circuit arrangement via a resistor R3. A control signal ST for control of the shunt device AE is provided at the output of inverter INV3.

The stabilization element SE has a parallel circuit comprising a resistor R4 and a transistor T4. The deactivation signal DIS is supplied to the control input of transistor T4. Transistor T4 is implemented, for example, as an n-channel field effect transistor. The drain terminal of transistor T4 is connected to the output of inverter INV3 and the source terminal or transistor T4 is connected to the second terminal K2 of the circuit arrangement.

The shunt device AE comprises a transistor T1, which is designed, for example, as an n-channel field effect transistor, and is connected between the first terminal K1 and the second terminal K2 of the circuit arrangement. The control signal ST is supplied to the control input of transistor T1.

The resistor R1 and capacitor C1 of the trigger element TE form an RC element with a first time constant. Resistor R10 and capacitor C10 of the deactivation element DE form a second time constant. The second time constant is about 10 times the first time constant.

If the circuit arrangement is connected to an external voltage source, it is in in-circuit state. On the other hand, if an external voltage source is absent, the circuit is in off-circuit state.

An ESD pulse arising in off-circuit state of the circuit arrangement causes a rise of the potential at the first terminal K1 of the circuit arrangement compared to the second terminal K2 of the circuit arrangement. The input of inverter INV1 remains at low. The output of inverter INV1 goes to high, so that the trigger signal TR is generated. The voltage at deactivation input K3 is likewise at low. Thus, the transistor T3 of the interruption unit UE is put into a blocking state and the transistor T2 of the interruption unit UE is put into a conducting state. Consequently, the trigger signal TR is transmitted to the inverter chain IK via transistor T2. The output of inverter INV2 thus goes to low and the output of inverter INV3 goes to high. This high of the control signal ST puts transistor T1 of shunt device AE in a conducting state. The ESD pulse is shunted via the conducting connection between the drain and source terminal of transistor T1.

In in-circuit state, i.e. if, for example, an external power supply is present, the input of inverter INV1 is at high. Therefore the trigger signal TR generated at the output of inverter INV1 is at low. Likewise the deactivation signal DIS at the deactivation input K3 of interruption unit UE is at high. Thus, transistor T2 is put into a blocking state and transistor T3 is put into a conducting state. Consequently, the trigger signal TR that is generated if an ESD pulse develops is not transmitted to the inverter chain IK. The input of inverter INV2 of the inverter chain IK remains at low. Thus, the control signal ST at the output of inverter chain IK is also at low and transistor T1 of shunt device AE is blocked. Transistor T4 of the stabilization element SE is also put into a conducting state by the high of the deactivation signal DIS and with that additionally ensures that the control input of transistor T1 remains at low. Therefore, even a high-frequency ESD event, which, because of the high parasitic gate-drain capacity of transistor T1, can cause an undesired switching of transistor T1 to conducting state, does not lead to just this conducting state, since the control input of transistor T1 is stabilized at low with the help of the transistor.

This circuit advantageously recognizes if it is in off-circuit or in-circuit state. Only ESD pulses occurring in off-circuit state are drained via the shunt device AE. Voltage peaks occurring in an in-circuit state between the first and second terminal K1 and K2 of the circuit are recognized by trigger element TE and lead to the generation of a trigger signal TR, but this signal is not transmitted to the inverter chain IK via the interruption unit UE and thus is also not transmitted to the shunt device AE. Such voltage peaks can be caused, for example, by switching operations of adjacent DC/DC converters. Advantageously, an undesired break-down of the supply voltage due to short circuiting of the two terminals K1 and K2 is prevented. On the other hand, electrostatic discharges occurring, for example, during manufacture or during transport of the circuit, which strike the circuit in power-down state, are reliably drained off.

In an advantageous development N-metal oxide semiconductors, or NMOS transistors, can be used, for example, for the n-channel field effect transistors T1, T3 and T4. In the same way a PMOS transistor can be used for the p-channel field effect transistor T2.

In an advantageous embodiment transistor T1 is dimensioned such that its resistance in the conducting state is as small as possible, so that high voltages up to about 2 kV can be rapidly shunted. This requires a large width-to-length ratio. This large width-to-length ratio causes a large capacitative load of transistor T1, which must be driven by the connected inverter INV3, so that transistor T1 can be put into the conducting state rapidly enough. Therefore, inverter INV3 has the largest width-to-length ratio of the three inverters INV1 to INV3 and is therefore the strongest driver. Inverter INV1 correspondingly has the smallest width-to-length ratio.

In another development the circuit can also be implemented without transistor T4.

Figure 2:
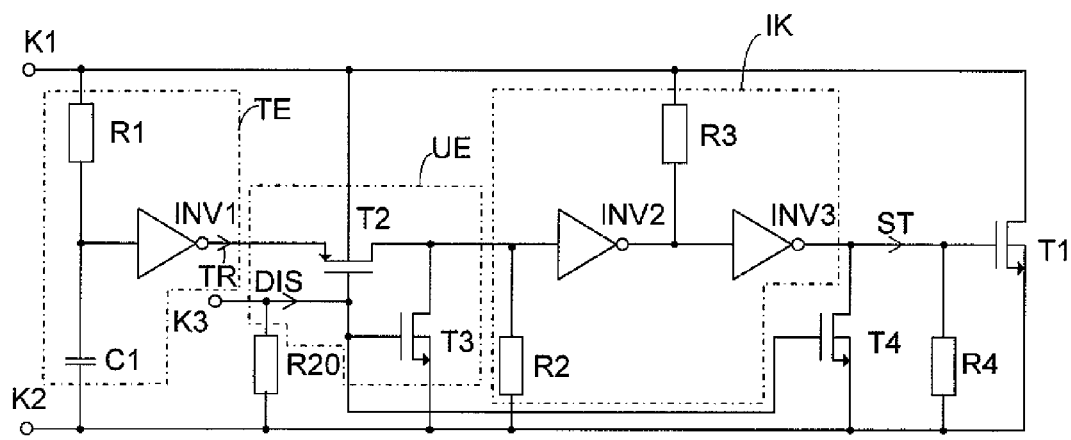
FIG. 2 shows another exemplary embodiment of a circuit arrangement in accordance with the proposed principle.

FIG. 2 shows another exemplary embodiment of the circuit arrangement in accordance with the proposed principle. The circuit in FIG. 2 corresponds to the circuit in FIG. 1, with deactivation element DE being omitted. Instead the deactivation signal DIS is supplied to the deactivation input K3 from outside of the circuit arrangement.

In off-circuit state deactivation input K3 is not supplied. The input of interruption unit UE is kept at the potential of the second terminal K2 via a resistor R20. Therefore, transistor T2 is in conducting state. An ESD pulse thus leads to generation of trigger signal TR in trigger element TE. The trigger signal TR is supplied as control signal ST to transistor T1 via transistor T2 and inverter chain IK. Transistor T1 therefore is put into a conducting state and can shunt the ESD pulse.

In in-circuit state the deactivation input K3 is connected to the power supply, for example with the first terminal K1 of the circuit. Thus, transistor T2 is in a disconnected state and the interruption element UE is activated. A trigger signal TR caused by an ESD event is not transmitted to the inverter chain IK. Transistor T1 always remains in disconnected state.

Advantageously, the circuit recognizes if it is in off-circuit or in-circuit state. Only ESD pulses arising in off-circuit state are reliably drained off. Voltage peaks arising in in-circuit state, which are caused, for example by adjacent DC/DC converters and can be falsely recognized as an ESD pulse, are not transmitted by the interruption unit UE. Thus they do not lead to a short circuit between the first terminal K1 and the second terminal K2 of the circuit. A collapse of the power supply is thus reliably prevented.

Advantageously, this embodiment requires an especially small chip area.

Reference Numbers
K1 First terminal
K2 Second terminal
K3 Deactivation input
R1, R2, R3, R4, R10, R20 Resistor
T1, T2, T3, T4 Transistor
C1, C10 Capacitor
INV1, INV2, INV3 Inverter
AE Shunt device
DE Deactivation element
IK Inverter chain
SE Stabilization element
TE Trigger element
UE Interruption unit
DIS Deactivation signal
ST Control signal
TR Trigger signal

The invention claimed is:

1. A circuit arrangement for protection against electrostatic discharges, comprising
   a shunt device connected between a first and a second terminal of the circuit arrangement and having a control input, via which a conductivity of the shunt device is controllable;
   a trigger element having a trigger output for issuing a trigger signal in dependence on a voltage between the first and the second terminals of the circuit arrangement; and
   an interruption unit comprising a series circuit having a first transistor and a second transistor, the interruption unit being controllable via a deactivation input by a supplied deactivation signal, the interruption unit being connected on an input side to the trigger output and on an output side to the control input;
   wherein a connecting point between a gate terminal of the first transistor and a gate terminal of the second transistor forms an activation input for supplying the deactivation signal.

2. The circuit arrangement as in claim 1, wherein the supplied deactivation signal distinguishes between an in-circuit and an off-circuit state of the circuit arrangement.

3. The circuit arrangement as in claim 1, wherein the shunt device comprises a transistor having a controlled path connected between the first and the second terminals of the circuit arrangement.

4. The circuit arrangement as in claim 1, wherein the shunt device comprises an n-channel field effect transistor having a controlled path connected between the first and the second terminals.

5. The circuit arrangement as in claim 1, wherein the trigger element is connected between the first and the second terminals.

6. The circuit arrangement as in claim 1, wherein the trigger element comprises a series circuit having a first resistor and a first capacitor and a first inverter connected at their connecting point.

7. The circuit arrangement as in claim 1, wherein the first transistor of the interruption unit is configured as a p-channel field effect transistor and the second transistor of the interruption unit is configured as an n-channel field effect transistor.

8. The circuit arrangement as in claim 1, further comprising:
   a series circuit having a second inverter and a third inverter, which is connected on an input side to the output of the interruption unit and on an output side to the control input of the shunt device.

9. The circuit arrangement as in claim 8, wherein the input of the second inverter is connected by a resistor to the second terminal of the circuit arrangement and the input of the third inverter is connected by another resistor to the first terminal of the circuit arrangement.

10. The circuit arrangement as in claim 8, further comprising:
    a stabilization element connected between the control input of the shunt device and the second terminal of the circuit arrangement.

11. The circuit arrangement as in claim 10, wherein the stabilization element includes a parallel circuit comprising a resistor and a transistor, whose control input is controlled by the deactivation signal.

12. The circuit arrangement as in claim 11, wherein the transistor of the stabilization element is configured as an n-channel field effect transistor.

13. A circuit arrangement as in claim 10, further comprising:
    a series circuit having a second resistor and a second capacitor with a connecting point for providing the deactivation signal;
    wherein the series circuit is connected between the first and the second terminals of the circuit arrangement.

14. The circuit arrangement as in claim 13, wherein the second resistor and the second capacitor form a second time constant which is 10 times larger than a first time constant formed by the first resistor and the first capacitor.

15. A method for shunting electrostatic discharges comprising:
    generating a trigger signal in dependence on a voltage between a first and a second terminal of a circuit arrangement;
    generating a deactivation signal in dependence on an availability of an external energy source;
    propagating the trigger signal via an interruption unit comprising a series circuit having a first transistor and a second transistor, the trigger signal being propagated in dependence on the deactivation signal supplied to an activation input of the interruption unit, and a connecting point between a gate terminal of the first transistor and a gate terminal of the second transistor forming the activation input; and
    connecting the first and second terminals of the circuit arrangement to be conducting if the trigger signal is present and the deactivation signal is not present.

16. The method as in claim 15, wherein the conducting connection is implemented by an n-channel field effect transistor.

17. The method as in claim 15, wherein the trigger signal is generated when a voltage between the first and the second terminals of the circuit arrangement is one of greater than a positive threshold value and less than a negative threshold value.

18. The method as in claim 15, wherein the deactivation signal is generated when the external energy source is connected.

* * * * *